United States Patent
Meltzer

(10) Patent No.: US 7,157,942 B2
(45) Date of Patent: Jan. 2, 2007

(54) DIGITAL FREQUENCY DIFFERENCE DETECTOR WITH INHERENT LOW PASS FILTERING AND LOCK DETECTION

(75) Inventor: David Meltzer, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 48 days.

(21) Appl. No.: 11/007,546

(22) Filed: Dec. 8, 2004

(65) Prior Publication Data

US 2006/0119398 A1    Jun. 8, 2006

(51) Int. Cl.
*H03D 3/24* (2006.01)
*H03D 13/00* (2006.01)

(52) U.S. Cl. ........................ 327/3; 2/12; 2/40
(58) Field of Classification Search .............. 327/2–3, 327/5, 7–8, 12, 156, 147, 157, 39, 40
See application file for complete search history.

(56) References Cited

U.S. PATENT DOCUMENTS

| | | | |
|---|---|---|---|
| 3,863,156 A | 1/1975 | Bogert | |
| 3,934,205 A | 1/1976 | Bogert | |
| 4,720,687 A | 1/1988 | Ostoich et al. | |
| 5,731,741 A | 3/1998 | Yamamoto et al. | |
| 6,100,721 A * | 8/2000 | Durec et al. | 327/3 |
| 6,310,653 B1 * | 10/2001 | Malcolm et al. | 348/537 |

* cited by examiner

*Primary Examiner*—Dinh T. Le
(74) *Attorney, Agent, or Firm*—Rosalio Haro

(57) ABSTRACT

A structure and method for implementing a fully digital frequency difference detector uses an n-bit counter to count cycles of a reference clock signal and an m-bit counter to count cycles of a synthesized clock signal, where m is greater than n. The two counters operate concurrently, and both are halted when the n-bit counter overflows into its $n^{th}$ bit position. Two latches respectively record if bits n and (n+1) in the m-bit become set prior to the n-bit counter overflowing. By observing the state of the two latches and the state of a predefined bit range within the m-counter, the frequency difference detector can determined if the frequency of the synthesized clock is greater than, less than, or locked to the frequency of the reference clock signal.

20 Claims, 4 Drawing Sheets

DIGITAL FREQUENCY DIFFERENCE DETECTOR WITH INHERENT LOW PASS FILTERING AND LOCK DETECTION

BACKGROUND OF THE INVENTION

1. Field of the Invention

The present invention relates generally to the field of frequency synthesizers. Specifically, the present invention relates to the field of digital frequency difference detector, such as used in conjunction variable oscillators to lock onto a reference frequency.

2. Description of the Related Art

Frequency synthesizing operations, such as using a variable oscillator for clock generation, are used in modern communication systems. Such frequency synthesizers are typically analog circuits, but to lower cost it would be desirable to implement such circuits using low cost digital CMOS processes.

A goal of variable oscillators is to synthesize a clock signal whose frequency is a multiple of a supplied reference clock source. It is desirable that the synthesized clock signal be locked onto the reference clock source, i.e. that a pulse edge of the synthesized signal be substantially coincident with a pulse edge of the reference clock source at regular pulse intervals. To accomplish this, precision clock synthesizers traditionally use a phase detector to compare a synthesized clock to a reference source and obtain a measure of their relative phase difference. The measured phase difference is used to adjust the scaled frequency of the synthesized signal, i.e. the generated clock, to match the reference clock frequency.

With reference to FIG. 1, a typical phase locked loop frequency synthesizer generates an Output Clock signal (periodic waveform) at a frequency that is a multiple of a stable Reference Clock Input. In the present case, the generated output clock frequency is a simple integer multiple of the reference clock frequency. It is well known how to extend this prior art frequency synthesizer to provide non integer multiples. The Reference Clock Input signal is traditionally applied to an analog phase and frequency detector (PFD) 201, which includes an analog charge pump. PFD 201 compares the Reference Clock Input signal with a frequency-divided, feedback signal a voltage controlled oscillator (VCO) 205. PFD 201 compares the phase and frequency of the VCO feedback signal with the Reference Clock Input signal to determine if the frequency output of VCO 205 is lower, higher, or locked onto the Reference Clock Input signal, and output a control signal, accordingly. The output from PFD 201 is passed through a low pass, loop filter 203 and applied to a control input of VCO 205, which adjusts the frequency of its synthesized Output Clock signal accordingly. At this point a synthesized Output Clock signal, or a proportional signal, is fed back through frequency divider 207 to repeat the process.

As shown, prior art designs generate the control voltage for the voltage controlled oscillator using a phase detector, or a combination phase and frequency detector, and a charge pump. Both of these approaches require a low pass loop filter to lock the VCO to the reference clock input. For high accuracy and low jitter synthesizers, the loop filter must have a low bandwidth which implies that the filter components are large. Note that the conventional prior art phase and frequency detector generates an output voltage which is strongly dependent on phase difference and weakly dependent on frequency difference. The loop filter must be designed to filter both responses. The near in phase detector response typically determines the filter characteristics to insure loop stability, which implies that the frequency dependent component is filtered very strongly. Furthermore, this use of phase to adjust frequency introduces instability into the frequency synthesis loop for well known reasons.

The use of a frequency difference detector to directly measure the frequency difference between the reference signal and the synthesized signal would be preferable to adjust the synthesized frequency. However, stable and easily implemented frequency only difference detectors are not known in the art. Combined phase/frequency detectors are well known, as shown in FIG. 1.

Prior art frequency only detectors have traditionally been complicated circuits involving the generation of analog signals at beat frequencies (which are the sum and difference frequencies of the reference and scaled synthesized clocks) and filtering the resultant signals to generate the required correction voltage for the synthesized, i.e. generated, clock oscillator. The use of analog signals is inconvenient since the clocks and scaling circuits of modern clock synthesizers are based on digital circuitry. A digital frequency difference detector is therefore desirable.

OBJECTS OF THE INVENTION

The present invention is directed to solving these problems.

An object of the present invention to generate a control signal representing a difference in frequency between two input signals independent of their phase difference, and which has fixed frequency relationship to a selected one of the two input signals.

It is a further object of the present invention that said generated control signal have no high frequency components which would disturb circuit using the generated control signal. This is equivalent to low pass filtering of the generated control signal.

It is a further object of the invention to provide a signal indicating that the two input signals are locked, i.e. their frequencies are within a predefined [small] absolute value of each other.

It is a further object of the present invention to accomplish the above objects using digital logic circuitry suitable for easy integrated onto an integrated circuit without [external] analog components.

SUMMARY OF THE INVENTION

To achieve these objects, a structure and method for implementing a fully digital frequency difference detector uses an n-bit counter to count cycles of a reference clock signal and an m-bit counter to count cycles of a synthesized clock signal, where m is greater than n. The two counters operate concurrently, and both are halted when the n-bit counter overflows into its $n^{th}$ bit position. Two memory cells respectively record if the $n^{th}$ bit and/or the $(n+1)^{th}$ bit within the m-bit become set to a logic high, "1", prior to the n-bit counter overflowing into its $n^{th}$ position. By observing the state of the two memory cells and the state of a predefined bit range within the m-counter (excluding a predefined range of least significant bits), the frequency difference detector can determined if the frequency of the synthesized clock signal is greater than, less than, or locked to the frequency of the reference clock signal.

That is, the digital frequency difference detector, FDD, includes an n-bit counter to count cycles of a reference frequency and an m-bit counter to count cycles of the oscillating output signal from a VCO, where m is greater than n. Both counters are reset, stopped, and started together in accordance with a control logic circuit.

The two memory cells, preferably implemented as latches, monitor the $n^{th}$ and $(n+1)^{th}$ bit within the m-bit counter and record when either of the $n^{th}$ or $(n+1)^{th}$ bit transition to a logic high. Both latches retain their recorded condition until they are reset by the control logic circuit irrespective of whether the $n^{th}$ or $(n+1)^{th}$ bit within the m-bit counter later transition back to a logic low while in the process of counting the cycles of VCO's output. Both counters are automatically stopped in response to the $n^{th}$ bit within the n-bit counter transitioning to a logic high. At this point, the current data contents of the m-bit counter, as well as the stored contents of the two memory cells are studied. A predetermined number of least significant bits (LSB's) within the m-bit counter are ignored to disregard any difference in the count of the n-bit counter and the m-bit counter due to relative phase differences between the VCO's output signal and the reference frequency signal. The FDD determines that the frequency of the VCO output is lower than the reference frequency if the first memory cell indicates that the m-bit counter has not overflowed out of its $n^{th}$ bit position and the second memory cell indicates that the m-bit counter has not overflowed out of its $(n+1)^{th}$ position. The FDD further determines that the frequency of the VCO signal is higher than the reference signal if the second memory cell indicates that the m-counter counter has overflowed out of its $(n+1)^{th}$ position. The FDD further determines that the frequency of the VCO signal is higher than the reference signal if said first memory cell indicates that said second counter has overflowed out of its $n^{th}$ bit position, and any bit within the m-bit counter excluding the predetermined number of least significant bits is set to a predetermined first logic state. Lastly, the FDD determines that the frequency of the VCO signal is locked to the reference signal if the first memory cell indicates that the m-bit counter has overflowed out of its $n^{th}$ position, and said second memory cell indicates that the m-bit counter has not overflowed out of its $(n+1)^{th}$ bit position, and no bit within the m-bit counter, excluding the predetermined number of least significant bits, is set to the first logic state.

The architecture of the FDD provides an inherent low pass filtering operation for filtering the frequency difference between the reference frequency signal and the VCO's output signal. The bandwidth of the FDD's inherent low pass filter is adjustable by increasing or decreasing the value of n in the n-bit counter and adjusting the increment/decrement digital step size of the second control signal sent to the VCO.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

Figure 1:
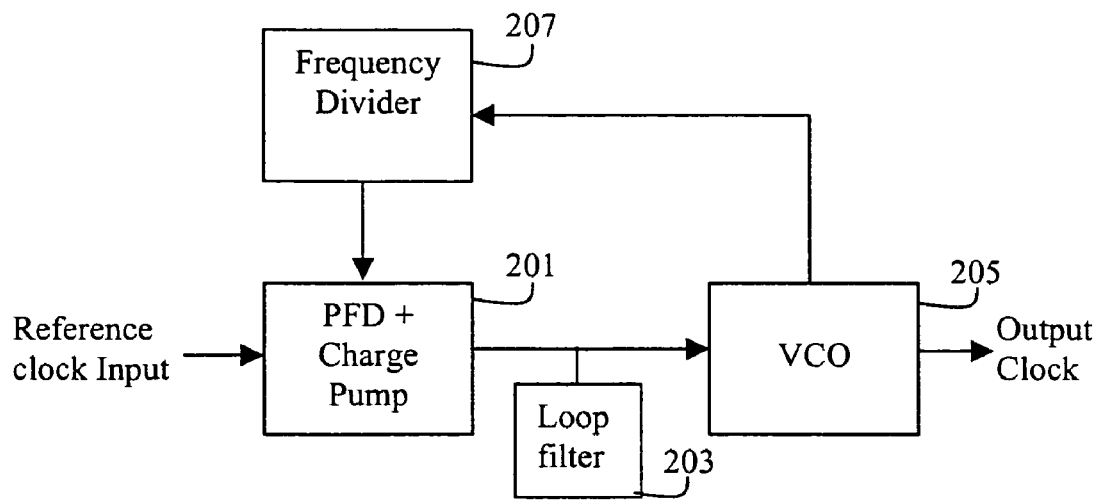
FIG. 1 is a block diagram of a typical frequency synthesizer using an analog phase/frequency detector and charge pump.
Figure 2:
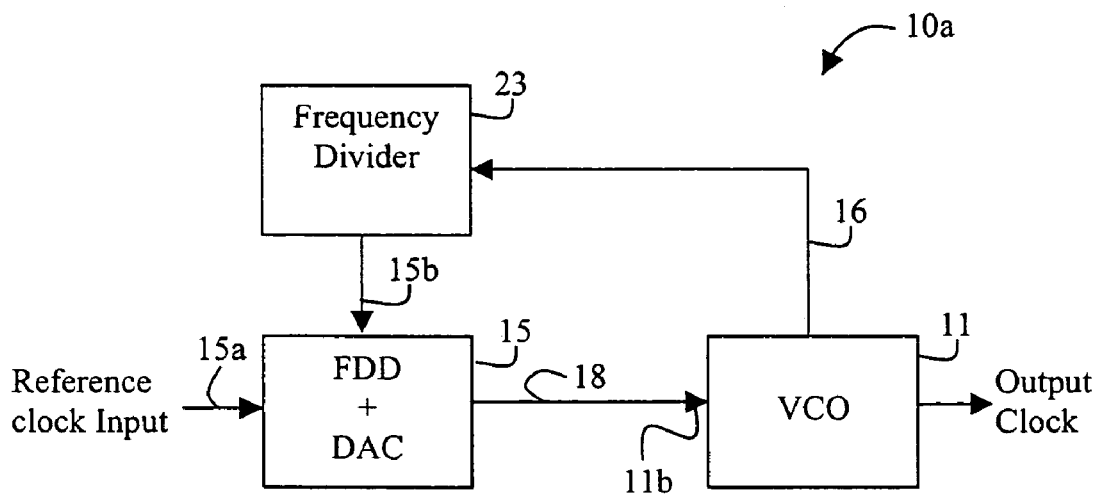
FIG. 2 is a block diagram of a frequency synthesizer using a digital frequency difference detector in accord with the present invention.

With reference to FIG. 2, a frequency synthesizer, or clock synthesizer, 10a including a digital Frequency Difference Detector, FDD, 15 in accord with the present invention does not require a loop filter. This is because the preferred structure of FDD 15 has an inherent low pass filtering effect, as is explained more fully below. FDD 15 receives two inputs 15a and 15b and produces a control output 18 indicative of a frequency difference between signals applied at inputs 15a and 15b. Control output 18 is preferably applied to a frequency control input of a variable oscillator, in the present case implemented as voltage controlled oscillator, VCO, 11. In the present embodiment, VCO 11 preferably has an analog frequency control input, and FDD 15 therefore includes a digital-to-analog converter, DAC, so the output of digital FDD 15 is converted into a representative analog voltage prior to being applied to VCO 11. Alternatively, VCO 11 may have a digital frequency control input, in which case the DAC within FDD 15 may be eliminated, and FDD 15 may provide direct digital control over VCO 11.

VCO 11 is further shown to provide a feedback signal 16 separate from its Output Clock signal. Feedback signal 16 is preferably a multiple, or copy, of the frequency of its Output Clock signal, and is applied to a frequency divider 23 prior to being feed to input 15b of FDD 15. It is be understood that the VCO's Output Clock signal may be directly fed back to frequency divider 23, in which no separate feedback signal 16 is needed.

Figure 3:
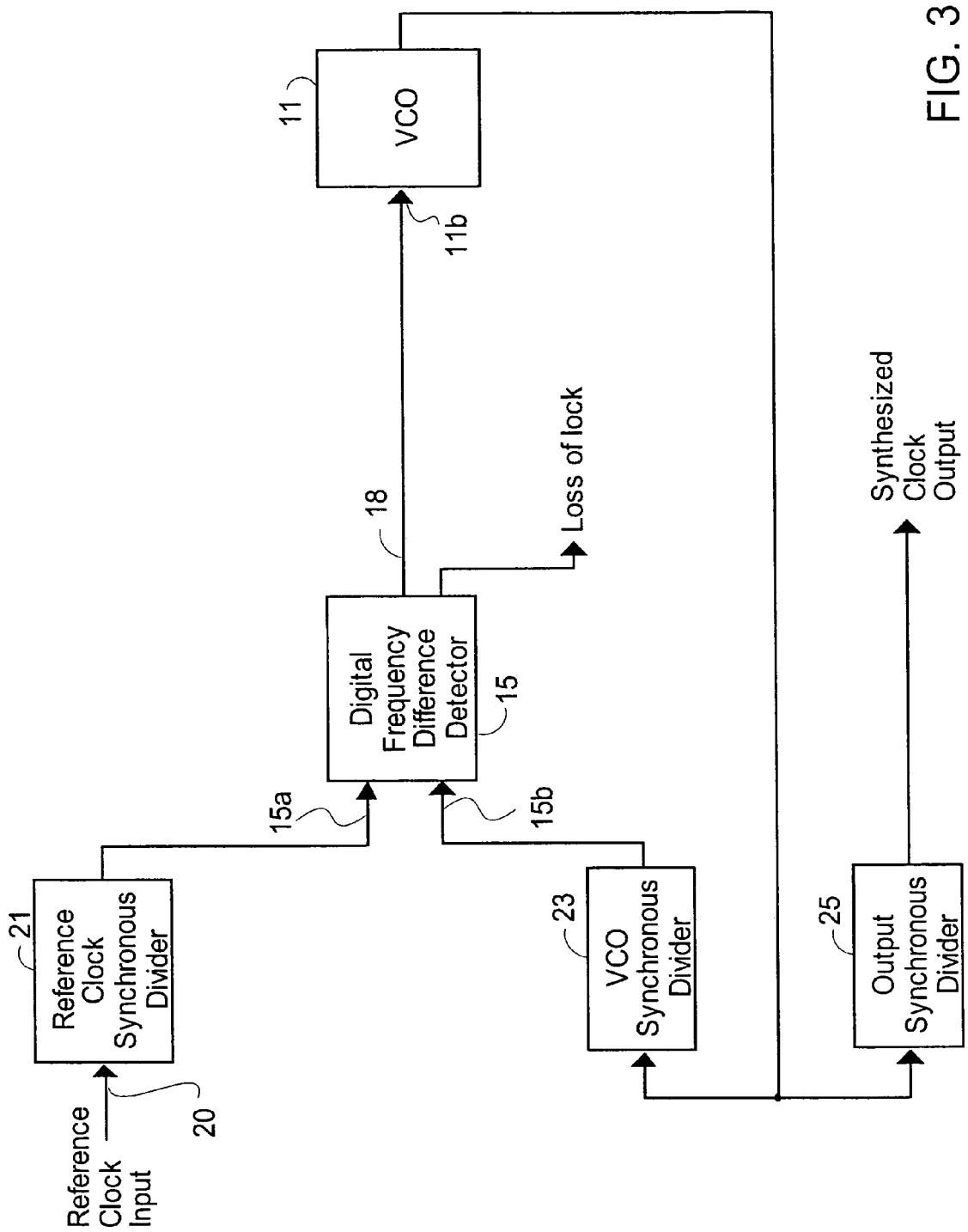
FIG. 3 is a block diagram of a second frequency synthesizer using a digital frequency difference detector in accord with the present invention.

With reference to FIG. 3, an alternate frequency synthesizer 10b utilizing digital Frequency Difference Detector, FDD, 15 in accord with the present invention may include a digital input variable oscillator 11, preferably a voltage controlled oscillator (VCO). VCO 11 produces an oscillator output signal whose frequency is dependent on its control input 11b, which is responsive to the output from FDD 15.

Digital frequency difference detector 15 has first 15a and second 15b frequency-detection inputs, and is effective for producing a control signal representative of the frequency difference of signals applied to its first 15a and second 15b frequency-detection inputs. Since in the present case VCD 11 has a digital control input 11b, it is also to be understood that the control signal output from digital frequency difference detector 15 is a digital signal, which may optionally be output onto a single conductive line or onto a signal bus, and has a digital value indicative of a frequency difference.

An input node 20 of frequency synthesizer 10b receives a reference frequency signal, which in the present case is embodied by a reference clock input signal. If desired, the reference clock input signal may be applied directly to frequency-detection input 15a, but it is preferred that the frequency of the reference clock input signal first be stepped down by passing it through a first frequency divider 21. The output of Reference Clock Synchronous Divider 21 is applied to digital frequency difference detector 15. It is to be understood that use of a frequency divider is a design choice for reducing design complexity.

In a similar manner, the oscillator output signal from VCO 11 may be fed back directly to second frequency-detection input 15b, but it is preferred that its frequency also first be stepped down by passing it through a second frequency divider, i.e. VCO Synchronous divider 23. In the present case the oscillator output signal is passed through another frequency divider, Output Synchronous Divider 25, to produce the Synchronized Clock Output signal of frequency synthesizer 10.

In this manner, frequency synthesizer 10 incorporates a digital loop defined by the path from digital frequency difference detector 15 to VCO 11 and back to frequency difference detector 15, which controls the frequency of VCO 11. Digital control provides frequency holdover and ease of implementation.

FDD 15, in accord with the present invention, preferable counts cycles of the reference clock (at its first input 15a) to determine a fixed interval of time. During this interval, cycles of the generated clock (at second input 15a of FDD 15) are also counted. The number of cycles, or pulses, of an input signal counted during the fixed reference interval is proportional to the input signal's frequency. FDD 15 may implement conventional digital logic to process the two counted values (i.e. the number of counted cycles of the reference clock and the number of counted cycles of the generated clock counted) to either determine an absolute frequency difference or determine the relative frequencies. It is to be understood that when the two numbers of counted cycles are equal, the frequencies of the reference clock and the generated clock are exactly identical and the generated clock is thus frequency locked to the reference clock.

When the variable oscillator, VCO 11, to be controlled is of the conventional analog VCO type, the absolute value of the frequency difference is not the most useful value. This is because the oscillator base frequency must be subtracted from it and then it must be multiplied by a gain factor Kv of the oscillator to generate a control voltage. In this case, the relative frequency is more useful.

Figure 4:
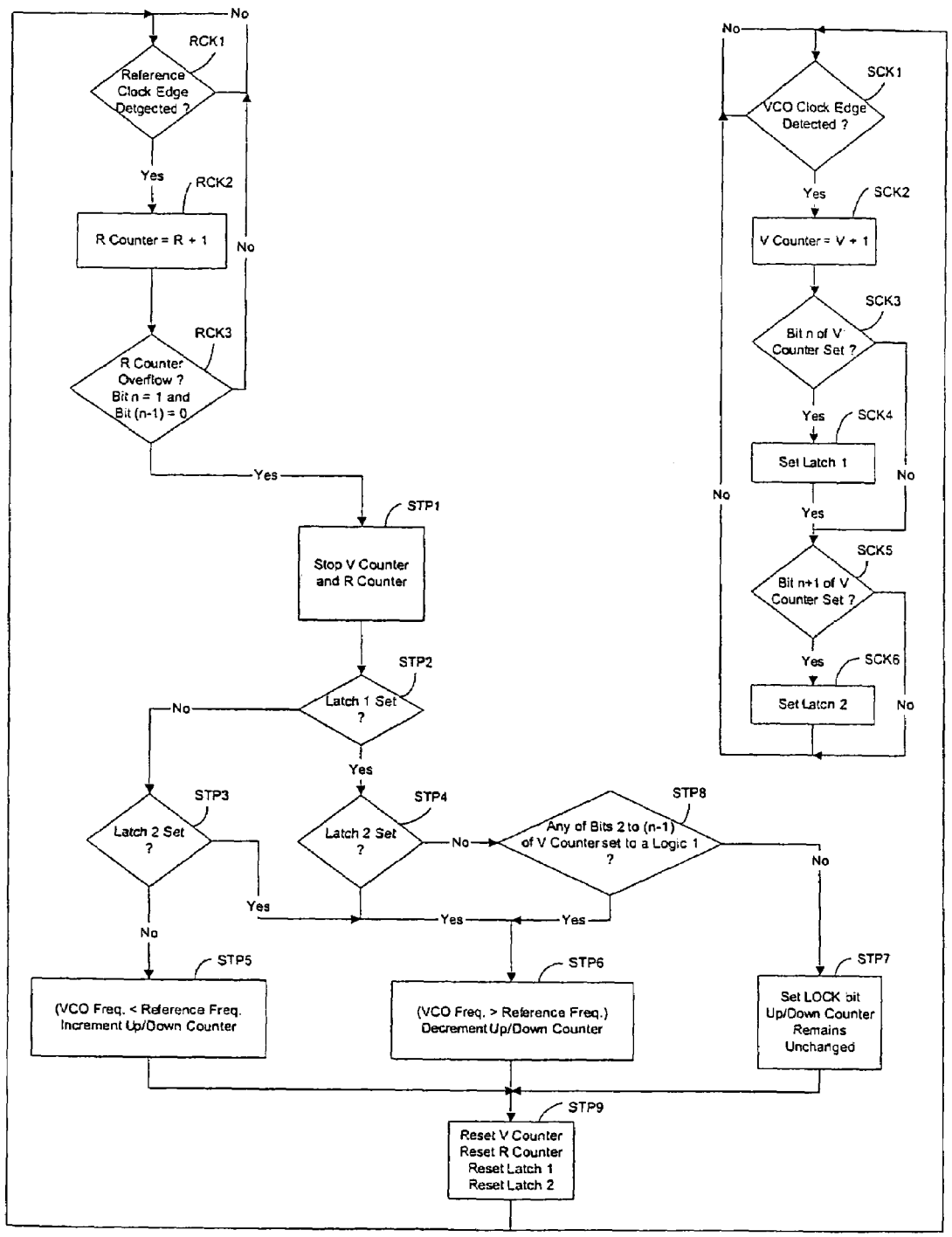
FIG. 4 describes a work flow describing the operation of the digital frequency difference detector of the present invention.

With reference to FIG. 4, a process flow describing the operation of FDD 15 to determine the relative frequency of two oscillating input signals (i.e. two clocks signals) at its inputs, 15a and 15b, can be divided into three process sections. Process steps RCK1 to RCK3 describe the process by which FDD 15 counts cycles of a reference clock at input 15a for a fixed reference interval. Process steps SCK1 to SCK6 describe the process by which FDD 15 counts the cycles of a synthesized clock (i.e. generated clock), and prepares to implement a quick comparison operation of both count values. Process steps STP1 to STP9 describe how FDD 15 uses the results of process steps RCK1-RCK3 and SCK1-SCK6 to quickly determined if the frequency of the synthesized clock signal is less then, greater than, or locked to the frequency of the reference clock signal.

Basically, two digital counters are used to separately, and concurrently, count cycles of the reference clock and the synthesized clock. The two counters are preferably edge-triggered and increment on one edge (either the rising edge or falling edge) of their respective input clock. Basically, an R counter (i.e. the first counter) counts cycles of the reference clock, and a V counter (i.e. the second counter) counts cycles of the variable controlled oscillation signal (i.e. the synthesized signals). The counters are further preferably binary ripple counters, which overflow from a maximum count to 0.

R counter, i.e. the first counter, is an n-bit counter and the time it takes to cycle though its n-bits and cause an overflow out of its $n^{th}$ bit defines the fixed interval of time over which the cycles of the synthesized clock are counted.

V Counter, i.e. the second counter, is an m-bit counter, where m is greater than n (i.e. m>=n+1). In process steps SCK4 and SCK6, two respective one bit latches (i.e. Latch 1 and Latch 2) are used to remember any overflows in the n and n+1 bit positions of the m-bit, V counter.

In process steps RCK1, each edge of the reference clock causes an increment of the R counter (step RCK2). Following each increment operation, the R counter is examined to check if an overflow into its $n^{th}$ bit has occurred. This is determined by monitoring its $n^{th}$ bit and its $(n-1)^{th}$ bit. If bit n is set to 1, and bit (n−1) is set to 0, then it is determined that the (n−1) bit must have transitioned from a 1 to a 0, and the n bit must have transitioned from a 0 to a 1. If no overflow into the $n^{th}$ is encountered, then process returns to step RCK1. Otherwise, process flow STP1.

Similarly, each observed transition edge (SCK1) of the vco clock (i.e. the synthesized signal input) causes the V counter to increment (SCK2). Whenever a count increment causes the $n^{th}$ bit of the V counter to become SET (i.e. become a logic 1) (SCK3), the first latch (Latch 1) is SET (SCK4) and remains SET. Whenever an increment causes the $(n+1)^{th}$ bit of the V counter to become SET (SCK5), the second latch (i.e. Latch 2) is SET (SCK6) and remains SET.

When process setp RCK3 identifies an overflow condition out of bit (n−1) into bit n in the R counter, the increment clock sources to both the r and v counters are stopped, freezing the contents of both counters (STP1). The contents of the R counter, Latch 1, and Latch 2 are used to determine the relative frequency of the reference clock and the synthesized clock.

If Latch 1 is not SET (STP2) and Latch 2 is also not SET (STP3), then the synthesized frequency is determined to be less than that of the reference clock and FDD 15 outputs a signal indicating that the synthesized frequency should be increased (STP5). In the present case, the output signal is provided by an Up/Down counter, and thus the Up/Down counter is incremented (STP5) to request an increase in frequency from the coupled VCO (i.e. the synthesized frequency). The Latch 2 must not be SET to ensure that not more than one complete cycle of the Vcounter has occurred.

The synthesized VCO frequency is greater than the reference clock frequency if more counts are present in the V counter than in the R counter following step STP1. This happens if both Latch 1 is SET (STP2) and Latch 2 is SET (STP4). This is also the case if Latch 1 is not SET (STP2), but Latch 2 is SET (STP3), indicating an overflow out of bit n into bit (n+1) of the V counter. Alternatively, more counts are also present in the V counter than in the R counter following step STP1 if Latch 1 is SET (STP2), latch 2 is not SET (STP4), and there are any logic 1's bit location 2 through (n−1) of the V counter (STP8). This indicates a count beyond the initial overflow from bit (n−1) into bit n, but not high enough to cause an overflow out of bit n into bit (n+1). Bit location 1 is not checked because there can be a 1 bit difference in the count due to relative phase differences between the synthesized and reference clocks. Irrespective of the case count and latch conditions, if it is determined that the synthesized signal frequency is greater than the reference clock frequency, FDD 15 responds by issuing a signal indicating that the synthesized frequency should be decreased, and therefore decrements the Up/Down counter (STP6).

If Latch 1 is SET, Latch 2 is not SET, and there are no 1 bits in any of the bit positions below the $n^{th}$ bit position (i.e. positions 2 through (n−1)) (STP8), then the synthesized clock signal and reference clock signal are determined to be locked. If desired, a LOCK bit may be SET (i.e. issued), and the Up/Down counter remains unchanged (STP7).

Following any of steps STP5 to STP7, the R counter, V counter, Latch 1 and Latch 2 are reset and a new measurement cycle begins (STP9).

The above description shows that a frequency comparison determination is made every $2^{(n-1)}$ periods of the reference clock. This is an inherent low pass filtering of the frequency difference value with a bandwidth defined by the frequency of the reference clock divided by $2^{(n-1)}$. This filtering bandwidth can be adjusted by increasing or decreasing the number of bits in the R counter. The accuracy of the frequency difference measurement can be adjusted by changing the number of bits in the R counter. It is to be noted, however, there is an inverse relationship between accuracy and filtering bandwidth. A circuit implementation of the process of FIG. 4 is shown in FIG. 5.

Figure 5:
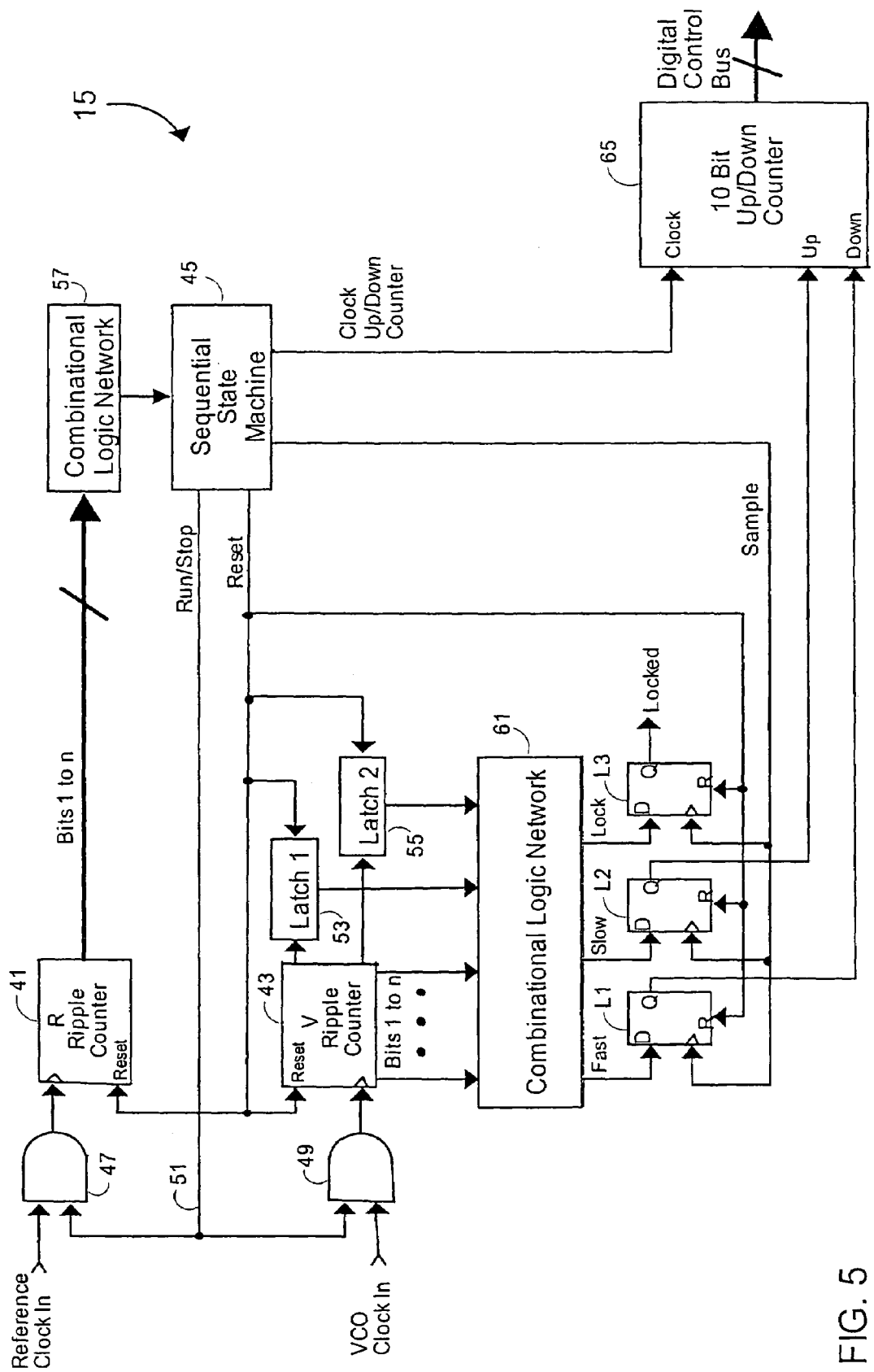
FIG. 5 is a block diagram of a digital frequency difference detector in accord with the present invention.

With reference to FIG. 5, a block structure of digital frequency difference detector, FDD 15, in accord with the present invention preferably includes two binary ripple counters 41 and 43, both having reset inputs controlled by a sequential state machine 45, which is part of a control logic circuit for coordinating the operation of the various logic blocks making up FDD 15. Ripple counters 41 and 43 increment on one edge (either the rising or falling logic edge) of signals applied to their respective inputs. The reference frequency signal of FIG. 2 (or a stepped down representation of it supplied from frequency divider 21 in FIG. 3) is coupled to the Reference Clock Input of first AND gate 47. First AND gate 47 functions as a masking gate to selectively allow the reference frequency signal applied to its Reference Clock Input to pass through and be applied to the input of ripple counter 41 as determined by RUN/STOP control signal 51 from sequential state machine 45, or to selectively halt the reference frequency signal and prevent the incrementing of ripple counter 41. Similarly, the oscillator output signal (i.e. the synthesized signal) from VCO 11 (or a stepped down representation of it supplied from frequency divider 23) is coupled to a VCO Clock input of a second AND gate 49, which functions as a second masking gate to selectively allow the oscillator output signal to pass through and be applied to the input of ripple counter 43 as determined by RUN/STOP control signal 51, or to selectively halt the oscillator output signal and prevent the incrementing of ripple counter 43.

In this manner, ripple counters 41 and 43 respectively count cycles of the reference frequency signal (at the Reference Clock Input node) and the oscillator synthesized signal (at the VCO Clock input node). Counter 41 is a binary counter of n bits, and counter 43 is binary counter of m bits, where m is greater than, or equal to, n+1. Two one-bit latches, 53 and 55, functions as memory cells to monitor the $n^{th}$ and $(n+1)^{th}$ bits among the m bits of counter 43, and to remember any overflows of the reference count through bit n and n+1. Latches 53 and 55 record when the $n^{th}$ bit and/or the $(n+1)^{th}$ bit of counter 43 transition from a logic low "0" to a logic high "1" (assuming that counter 43 is an up-counter).

Preferably, each rising edge of a signal at the Reference Clock Input causes counter 41 to increment its count, and each rising edge of a signal at the VCO Clock input causes the counter 43 to increment its count. Preferably, whenever the $n^{th}$ bit of counter 43 is set, i.e. transitions to a logic high, due to an increment-count operation, latch 53 is SET and remains SET until it is cleared by sequential state machine 45, irrespective of whether the $n^{th}$ bit later transition back to a logic low due to continued counting by counter 43. Whenever the $(n+1)^{th}$ bit of counter 43 is set, i.e. transitions to a logic high, due to an increment-count operation, latch 55 is SET and remains SET until it is cleared by sequential state machine 45.

The count value of counter 41 is monitored by a combinational logic network 57, which conveys the information to sequential state machine 45. Specifically, combinational logic network 57 monitors the $n^{th}$ and $(n-1)^{th}$ bits of counter 41. When the $n^{th}$ bit of counter 41 is set (i.e. transitions to a logic high) and its $(n-1)^{th}$ bit is reset (i.e. transitions back to a logic low), indicating an overflow out of bit (n-1) into bit n, sequential state machine 45 issues the RUN/STOP signal to masking gates 47 and 49 to stop the increment-count operations of both counters 41 and 43. This freezes the count contents of both counters 41 and 43.

When counter 41 is stopped, its count contents and the set conditions of latches 53 and 55 are examined and used to determine the relative frequency of the reference frequency signal and oscillator output signal, as observed at the Reference Clock Input and VCO Clock Input, respectively. In the present example, this determination is made by a second combinational logic network 61. It is to be understood that sequential state machine 45, first combinational logic circuit 57 and second combinational logic circuit 61 may be integral parts of a general control logic circuit of FDD 15. If combinational logic network 61 determines that the frequency of the oscillator output signal is higher than the frequency of the reference frequency signal, then it will transmit signal FAST to a first latch L1. If combinational logic network 61 determines that the frequency of the oscillator output signal is lower than that of the reference frequency signal, then it will transmit signal SLOW to second latch L2. If combinational logic network 61 determines that the frequency of the oscillator output is locked to that of the reference frequency signal, then it transmit signal LOCK to third latch L3. Latches L1, L2 and L3 latch in the transmitted signal from combinational logic network 61 in response to command signal SAMPLE issued from sequential state machine 45.

The frequency of the oscillator output signal from VCO 11 is determined to be less than the reference frequency signal if both latches 53 and 55 are not set. Latch 55 must also be off to ensure that more than one complete cycle of counter 43 has not occurred.

The frequency of the oscillator output signal from VCO 11 is determined to be greater than the frequency of the reference frequency signal if more count operations took place in counter 43 than in counter 41. This is the case if either of two conditions are met. The frequency of the oscillator output signal is greater than that of the reference frequency signal if both latches 53 and 55 are set, indicating an overflow out of bit n of counter 43, or if latch 55 is set and there are any logic high bits in stages 2 through n of counter 43. The least significant bit (LSB) (i.e. stage 1) is not checked because there can be a 1 bit difference in the count due to relative phase differences between the oscillator output signal and the reference frequency signal. In the present case, only stage 1, i.e. the lowest value bit, is ignored to account for this possible phase difference. But other number of least significant bits (i.e. such as stages 1 and 2) may be ignored to account for this possible phase difference.

Alternatively, if latch 53 is set and latch 55 is not set, and if there are no logic highs set in any of the bits below the nth bit of counter 43 (excluding the LSB bits that are ignored due to possible phase difference), then the oscillator clock signal and the reference frequency signal are determined to be locked.

After this determination is made, the counters 41 and 43 can be reset and a new measurement cycle can begin. The measurement of the relative frequency of the oscillator output signal and the reference frequency signal stored in latches L1, L2, and L3 indicating either fast, slow or locked are conveyed to an up/down counter 65. Sequential state machine 45 then generates a clock signal for up/down counter 65 to respond to the latched conditions.

The above description shows that a measurement is taken every 2(n−1) periods of the Reference Clock Input. This is an inherent low pass filtering operation of the frequency difference value. The actual time constant of the response of this filter is dependent on the Reference Clock Input, i.e. the reference frequency signal [which determines the measurement interval], the frequency difference and the number of bits in up/down counter 65**. The filter bandwidth can be adjusted by increasing or decreasing the number of bits in the counter and the increment/decrement step size of the up/down counter.

The accuracy of the frequency difference measurement can be adjusted by changing the number of bits in counters 41 and 43. Changing the number of bits in counters 41 and 43 also changes the measurement interval. There is an inverse relationship between accuracy and filtering bandwidth. Increasing the measurement interval also increases the acquisition time of the loop.

In the present example, VCO 11 preferably has an analog input, and therefore, the output from Up/Down Counter 65 would be applied to a Digital-to-Analog converter (DAC), not shown, to produce an analog control input for VCO 11. The resolution of up/down counter 65 would preferably equal to the resolution of the DAC.

Preferably, the contents of Up/Down counter 65 are incremented by 1 if the VCO frequency is less then the reference frequency and are decremented by 1 if the VCO frequency is greater then the reference frequency. Up/Down counter 65 remains unchanged if the two frequencies are locked. The VCO will then be adjusted over many measurement intervals to equal the reference frequency. It will be obvious that more sophisticated increment/decrement algorithms could be used. For example, the amount of increment/decrement could be made proportional to the absolute value of the frequency difference. This will make the VCO approach lock faster than simply incrementing/decrementing by 1.

What is claimed is:

1. A frequency difference detector for detecting the frequency difference between first and second signals, comprising:
   a first input for receiving said first signal;
   a second input for receiving said second signal;
   a first counter configured to count pulses of the first input signal;
   a second counter configured to count pulses of the second input signal, said second counter being capable of a higher bit count than said first counter;
   a first memory for storing a logic value indicating that said second counter has overflowed out of a first bit position in response to said second counter overflowing out of said first bit position;
   a second memory for storing a logic value indicating that said second counter has overflowed out of a second bit position in response to said second counter overflowing out of said second bit position; and
   a logic circuit effective for responding to said first counter overflowing out of its corresponding first bit position, by examining the current bit value of the second counter and the stored logic values said first and second memories and determining from theses examined values if said first signal has a higher frequency than said second signal.

2. The frequency difference detector of claim 1, wherein said first memory is a first data latch and said second memory is a second data latch.

3. The frequency difference detector of claim 1, wherein in response to said first counter overflowing out of its corresponding first bit position, said logic circuit is further effective for determining if the frequency of said first signal is higher or substantially similar to the frequency of said second signal.

4. The frequency difference detector of claim 1, wherein in response to said first counter overflowing out of its corresponding first bit position, said logic circuit is further effective for issuing an output signal proportional to a frequency difference between said first and second signals.

5. The frequency difference detector of claim 1 wherein said first and second counters are halted in response to said first counter overflowing out of its corresponding first bit position.

6. The frequency difference detector of claim 1 wherein the second bit position is at a higher numeric position than said first bit position.

7. The frequency difference detector of claim 1, wherein in response to said first counter overflowing out of its corresponding first bit position, said logic circuit is further effective for determining:
   a) that the frequency of said second signal is lower than said first signal if said first memory is not storing the logic value indicating that said second counter has overflowed out of said first bit position and said second memory is not storing the logic value indicating that said second counter has overflowed out of said second bit position;
   b) that the frequency of said second signal is higher than said first signal if said second memory is storing the logic value indicating that said second counter has overflowed out of said second bit position; or
   c) that the frequency of said second signal is higher than said first signal if said first memory cell is storing the logic value indicating that said second counter has overflowed out of said first bit position, and any bit within the second counter excluding a predetermined number of least significant bits is set to a predetermined first logic state; or
   d) that the frequency of said second signal is locked to said first signal if said first memory is storing the logic value indicating that said second counter has overflowed out of said first bit position, and said second memory is not storing the logic value indicating that said second counter has overflowed out of said second bit position, and no bit within said second counter excluding said predetermined number of least significant bits is set to said first logic state.

8. A digital frequency difference detector, comprising:
   a first frequency detection input for receiving a first signal;
   a second frequency detection input for receiving a second signal;
   an n-bit counter for counting pulses received at said first frequency-detection input, whereby said n-bit counter maintains a pulse-count of said first signal;

an m-bit counter for counting pulses received at said second frequency detection input, whereby said m-bit counter maintains a pulse-count of said second signal, and wherein m is greater than n;

a first memory cell for storing a SET condition in response to the $n^{th}$ bit within said m-bit counter transitioning into a first logic state and for maintaining said SET condition irrespective of said $n^{th}$ bit within said m-bit counter transitioning out of said first logic state;

a second memory cell for storing a SET condition in response to the $(n+1)^{th}$ bit within said m-bit counter transitioning into said first logic state and for maintaining said SET condition irrespective of said $(n+1)^{th}$ bit transitioning out of said first logic state;

wherein said n-bit counter and said m-bit counter are halted in response to the $n^{th}$ bit within said n-bit counter transitioning into said first logic state; and wherein upon said halting of said n-bit and m-bit counters, said digital frequency difference detector determines:

a) that the frequency of said second signal is lower than said first signal if neither of said first or second memory cells have said SET condition stored; or b) that the frequency of said second signal is higher than said first signal if said second memory cell has said SET condition stored; or c) that the frequency of said second signal is higher than said first signal if said first memory cell has said SET condition stored and any bit within said m-bit counter excluding a predetermined number of least significant bits is set to said first logic state; or d) that the frequency of said second signal is locked to said first signal if said first memory cell has said SET condition stored and said second memory cell does not have said SET condition stored and no bit within said m-bit counter excluding said predetermined number of least significant bits is set to said first logic state.

9. The digital frequency difference detector of claim 8, wherein said predetermined number of least significant bits is one.

10. The digital frequency difference detector of claim 8, wherein:

said first and second memory cells are first and second latches, respectively;

said first and second latches store said SET condition by being set to, i.e. latching-in, said SET condition; and said first and second latches may selectively remove said SET condition by being set to a RESET condition.

11. The digital frequency difference detector of claim 10, wherein said first and second latches are set to said SET condition by latching-in one of a logic high state and a logic low state.

12. The digital frequency difference detector of claim 10, further comprising a control logic circuit, wherein:

said first latch is reset in response to said control logic circuit;

said second latch is reset in response to said control logic circuit; and said first and second latches are reset following the determination of whether the frequency of said second signal is lower than, greater than, or locked to said first signal.

13. The digital frequency difference detector of claim 12, further comprising:

a first masking gate responsive to said control logic circuit and effective for selectively coupling and decoupling said first frequency-detection input to and from said n-bit counter as determined by said control logic circuit, wherein said n-bit counter counts pulses received at said first frequency-detection input when said first masking gate couples said first frequency-detection input to said n-bit counter, and ceases to count pulses received at said first frequency detection input when said first masking gate decoupled said first frequency-detection input from said n-bit counter, whereby said n-bit counter is halted; and a second masking gate responsive to said control logic circuit and effective for selectively coupling and decoupling said second frequency-detection input to and from said m-bit counter as determined by said control logic circuit, wherein said m-bit bit counter counts pulses received at said second frequency-detection input when said second masking gate couples said second frequency-detection input to said m-bit counter, and ceases to count pulses received at said second frequency detection input when said second masking gate decoupled said second frequency-detection input from said m-bit counter, whereby said m-bit counter is halted.

14. The digital frequency difference detector of claim 12, further comprising an up/down counter, and said control logic circuit instructs said up/down counter to:

make a count step change in one of an up or down direction if the frequency of said first signal is determined to be higher than said first signal, make a count step change in the other of said up or down direction if the frequency of said second signal is determined to be lower than said first signal, or remain unchanged if the frequency of said second signal is determined to be locked to said first signal;

wherein the output of said up/down counter is coupled to said variable oscillator.

15. The digital frequency difference detector of claim 14, wherein at least one of said n-bit counter or up/down counter is further effective for low pass filtering the frequency difference between the first and second signals; and wherein a bandwidth of said low pass filtering is adjustable by increasing or decreasing the value of n in said n-bit counter or adjusting the increment/decrement step size of said up/down counter.

16. A method for detecting a frequency difference between a first signal and a second signal, said method comprising:

monitoring said first signal to count pulses in said first signal up to a first predetermined value;

monitoring said second signal to count pulses in said second signal;

when the pulse count of said first signal reaches said predetermined value, comparing said predetermined value with a current pulse count of said second signal, and determining:

a) that a frequency of the second signal is lower than the frequency of the first signal if the predetermined value is greater than the pulse count of the second signal by an amount greater than a predefined margin; or b) that the frequency of the second signal is greater than the frequency of the first signal if the predetermined value is less than the pulse count of the second signal by an amount greater than said predefined margin; and c) that the frequency of the second signal is locked to the frequency of the first signal if magnitude of the difference between the predefined value and the pulse count of the second signal is within said predefined margin.

17. The method of claim 16, further comprising:
issuing a status signal indicating whether the second signal was determined to be of greater frequency than, lower frequency than, or locked to the first signal.

18. The method of claim 17, further comprising:
resetting the pulse count of the first and second signals following the issuance of said status signal, and reinitiating the counting of pulses in said first and second signal.

19. A frequency difference detector implementing the method of claim 16 for detecting a frequency difference between a first signal and a second signal, wherein the frequency difference detector includes:
an n-bit counter for counting pulses in the first signal;
an m-bit counter for counting pulses in the second signal, m being greater than n;
a first memory cell; and
a second memory cell;
said method further comprising:
storing a SET condition in the first memory cell in response to the $n^{th}$ bit within said m-bit counter transitioning to a first logic state;
storing a SET condition in the second memory cell in response to the $(n+1)^{th}$ bit within said m-bit counter transitioning to said first logic state;
halting the first and second counters in response to the $n^{th}$ bit within said n-bit counter transitioning to said first logic state;

if neither the first or second memory cells are storing the SET condition, then determining that the frequency of the second signal is lower than the frequency of the first signal;
if the first memory cell is not storing the SET condition but the second memory cell is storing the SET condition, then determining that the frequency of the second signal is greater than the frequency of the first signal;
if both the first and second memory cells are storing the SET condition, then determining that the frequency of the second signal is greater than the frequency of the first signal;
if the first memory cell is storing the SET condition but the second memory cell is not storing the SET condition, then if any bit within said m-bit counter excluding a predetermined number of least significant bits is set to said first logic state, then determining that the frequency of the second signal is greater than the frequency of the first signal; and
if the first memory cell is storing the SET condition but the second memory cell is not storing the SET condition, then if no bit within said m-bit counter excluding said predetermined number of least significant bits is set to said first logic state, then determining that the frequency of the second signal is locked to the frequency of the first signal.

20. A frequency difference detector of claim 19, wherein following the determination of whether the frequency of the second signal is greater than, lower than, or locked to the frequency of the first signal, the first and second counters are reset and restarted.

* * * * *